(12) United States Patent
Kliman et al.

(10) Patent No.: US 6,507,797 B1
(45) Date of Patent: Jan. 14, 2003

(54) DIRECT CURRENT MACHINE MONITORING SYSTEM AND METHOD

(75) Inventors: Gerald Burt Kliman, Niskayuna, NY (US); Richard Kenneth Barton, Erie, PA (US); Paul Robert Hokanson, Girard, PA (US); Michael Paul Treanor, Scotia, NY (US); Rudolph Alfred Albert Koegl, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 268 days.

(21) Appl. No.: 09/579,488

(22) Filed: May 30, 2000

(51) Int. Cl.$^7$ ............................................. G01R 23/18

(52) U.S. Cl. ...................... 702/75; 324/76.22

(58) Field of Search .............................. 702/75, 33–35, 702/57–60, 76–78, 81, 82, 106, 145, 146, 199; 73/1.08, 660, 514.02; 324/512, 513, 520, 522, 166, 76.19, 76.22

(56) References Cited

U.S. PATENT DOCUMENTS

| | | | |
|---|---|---|---|
| 4,761,703 A | | 8/1988 | Kliman et al. |
| 5,365,787 A | * | 11/1994 | Hernandez et al. .... 324/207.25 |
| 5,729,145 A | | 3/1998 | Blades |
| 5,816,122 A | * | 10/1998 | Benning et al. ............... 408/11 |
| 6,199,019 B1 | * | 3/2001 | Iino et al. .................... 702/109 |

OTHER PUBLICATIONS

H. Bishop, et al, Determination of the Quality of Commutation in a D.C. Machine, 2$^{nd}$ International Conference on Electrical Machines Design and Applications, Sep. 1985, Pub. No. 254, pp. 275–279.

B. Plyushch, et al "Measurement of Sparking Intensity in D.C. Motors", Izvestiya Vysshikh Uchebnykh Zavedenii Elektromekhanika Journal, No. 4, 1969, pp. 385–390.

S. Desai, "Sensing Poor Commutation to Detect Impending Failures in DC Machines", 1$^{st}$ International Machinery Monitoring and Diagnostic Conference, pp. 683–689.

M. Treanor, et al, "Incipient Fault Detection in Locomotive DC Traction Motors", Proceedings of the 49$^{th}$ Meeting of the Society for Machinery Failure Prevention Technology, 1995, pp. 221–230.

A. Still, "Elements of Electrical Design", McGraw–Hill Book Co, Inc., 1932, pp. 208–214.

M. Treanor, et al, "Commutation Monitoring in Locomotive DC Traction Motors", Report of the Diesel Electrical Maintenance Committee, Proceedings of the 57$^{th}$ Annual Meeting, Chicago, 1995, pp. 152–157.

D. Steeples, "On–Line Commutation Monitoring of Locomotive DC Traction Motors in Service", Proceedings of the 8$^{th}$ International Congress on Condition Monitoring and Diagnostic Engineering Management, vol. 2, 1995, pp. 709–713.

(List continued on next page.)

Primary Examiner—Marc S. Hoff
Assistant Examiner—Edward Raymond
(74) Attorney, Agent, or Firm—Ann M. Agosti; Patrick K. Patnode

(57) ABSTRACT

A direct current machine monitoring system includes a current sensor for monitoring load current of the machine; and a computer for obtaining a power spectrum in a range including a machine trait-passing frequency, determining a magnitude of a maximum peak in the power spectrum in a range including the trait-passing frequency plus or minus an uncertainty frequency, and evaluating the magnitude of the maximum peak to assess a condition of the machine. The computer may additionally or alternatively be used for obtaining a low frequency power spectrum of the load current, obtaining at least one magnitude of a component of the power spectrum at a respective predicted frequency, and evaluating the at least one magnitude of the component to assess the condition of the machine.

31 Claims, 5 Drawing Sheets

OTHER PUBLICATIONS

G. Kliman, et al, "Noninvasive Detection of Broker Rotor Bars in Operating Induction Motors", IEEE Trans of Energy Conversion, vol. 3, No. 4, Dec. 1988, pp. 873–879.

M. Steele, et al, "Applications of an Electrical Method for Condition Monitoring of Motors", Motorcon Sep. 1982 Proceedings, pp. 321–335.

D. Steeples, et al, "On–Line Commutation Monitoring of Locomotive DC Traction Motors in Service", Proceedings of the $49^{th}$ Meeting of the Society for Machinery Failure Prevention Technology, 1995, pp. 709–713.

M. Steele, et al, "An Electrical Method for Condition Monitoring of Motors", IEE Conference on Electrical Machines—Design and Applications, PUB 213, Jul. 1982, pp. 231–235.

* cited by examiner

DIRECT CURRENT MACHINE MONITORING SYSTEM AND METHOD

BACKGROUND

The invention relates generally to direct current machines and more particularly to direct current machine monitoring systems.

A degraded commutator of a direct current (dc) machine will show excessive sparking as brushes bounce over the rough surface and the conduction period for a particular segment ends prematurely or as a winding remains shorted for too long by a spark region which extends between segments. Ultimately a short circuit will develop, through an extended spark region over the commutator bars, between opposite-polarity brushes. This "flashover" is often severe enough to destroy the machine. Sparking can additionally be caused by factors such as worn down brushes, improper brush positioning, or load or supply problems, for example.

On-line monitoring of commutation quality degradation as a measure of brush and/or commutator degradation or wear, for example, or as a precursor to flashover in dc machines can provide a significant advantage in steel mill, paper mill, and locomotive applications, for example, wherein visual inspection during operation is unsafe or otherwise impractical. As described in Michael P. Treanor and Gerald B. Kliman, "INCIPIENT FAULT DETECTION IN LOCOMOTIVE DC TRACTION MOTORS," Proceedings of the 49$^{th}$ Meeting of the Society for Machinery Failure Prevention Technology, Virginia Beach, Va., April 1995, pp. 221–230, machine condition monitoring for poor commutation can be achieved by frequency-domain analysis of machine current at the frequency of bar passing. The bar-passing frequency can be determined by multiplying the number of commutator bars by the speed (rotation frequency) of the motor. The magnitude of the peak at the bar-passing frequency increased by a factor of at least two when the commutation quality was degraded by incorrectly aligning the brushes. To provide an unambiguous determination of the bar passing frequency, the speed of the motor needs to be obtained with sufficient certainty and precision.

Additionally, once an assessment of commutation quality has been made, it would further be advantageous to assess whether the cause of any degradation resulted from commutator roughness or distortion as compared with non-commutator factors such as brush wear, improper positioning of brushes, or load or supply problems. By identifying the cause, proper maintenance and/or repair can be initiated.

BRIEF SUMMARY

Briefly, in accordance with one embodiment of the present invention, a system for determining a rotation frequency of a direct current machine comprises (a) a sensor for monitoring load current of the machine; and (b) a computer for (i) obtaining a first power spectrum of the load current, (ii) identifying significant peaks of the power spectrum, (iii) identifying one of the significant peaks as indicative of rotation frequency, and (iv) identifying a frequency of the identified peak as the rotation frequency.

In accordance with another embodiment of the present invention, a direct current machine monitoring system comprises (a) a current sensor for monitoring load current of the machine; and (b) a computer for (i) obtaining a power spectrum in a range including a machine trait-passing frequency, (ii) determining a magnitude of a maximum peak in the power spectrum in a range including the trait-passing frequency plus or minus an uncertainty frequency, and (iii) evaluating the magnitude of the maximum peak to assess a condition of the machine.

In accordance with another embodiment of the present invention, a direct current machine monitoring system comprises (a) a current sensor for monitoring load current of the machine; and (b) a computer for (i) obtaining a low frequency power spectrum of the load current, (ii) obtaining at least one magnitude of a component of the power spectrum at a respective predicted frequency, and (iii) evaluating the at least one magnitude of the component to assess a condition of th machine.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTIONS

Figure 1:
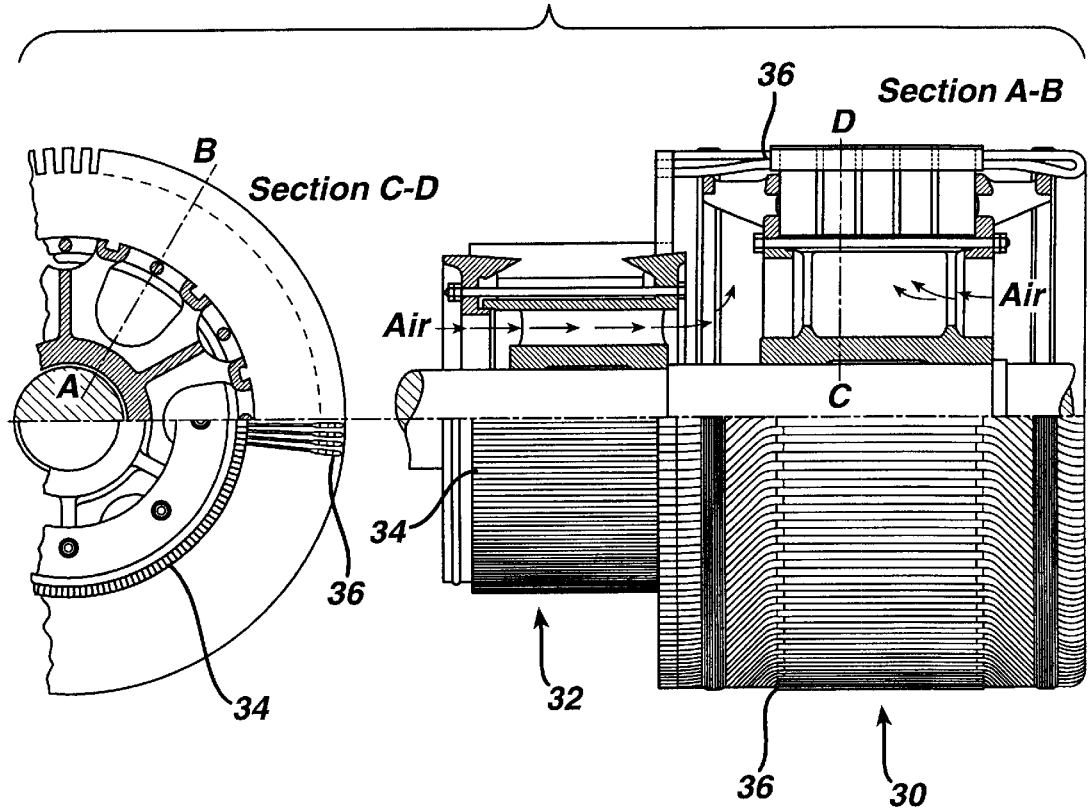
FIG. 1 includes partially cross-sectional axial and longitudinal views of a conventional dc machine commutator and armature.
Figure 2:
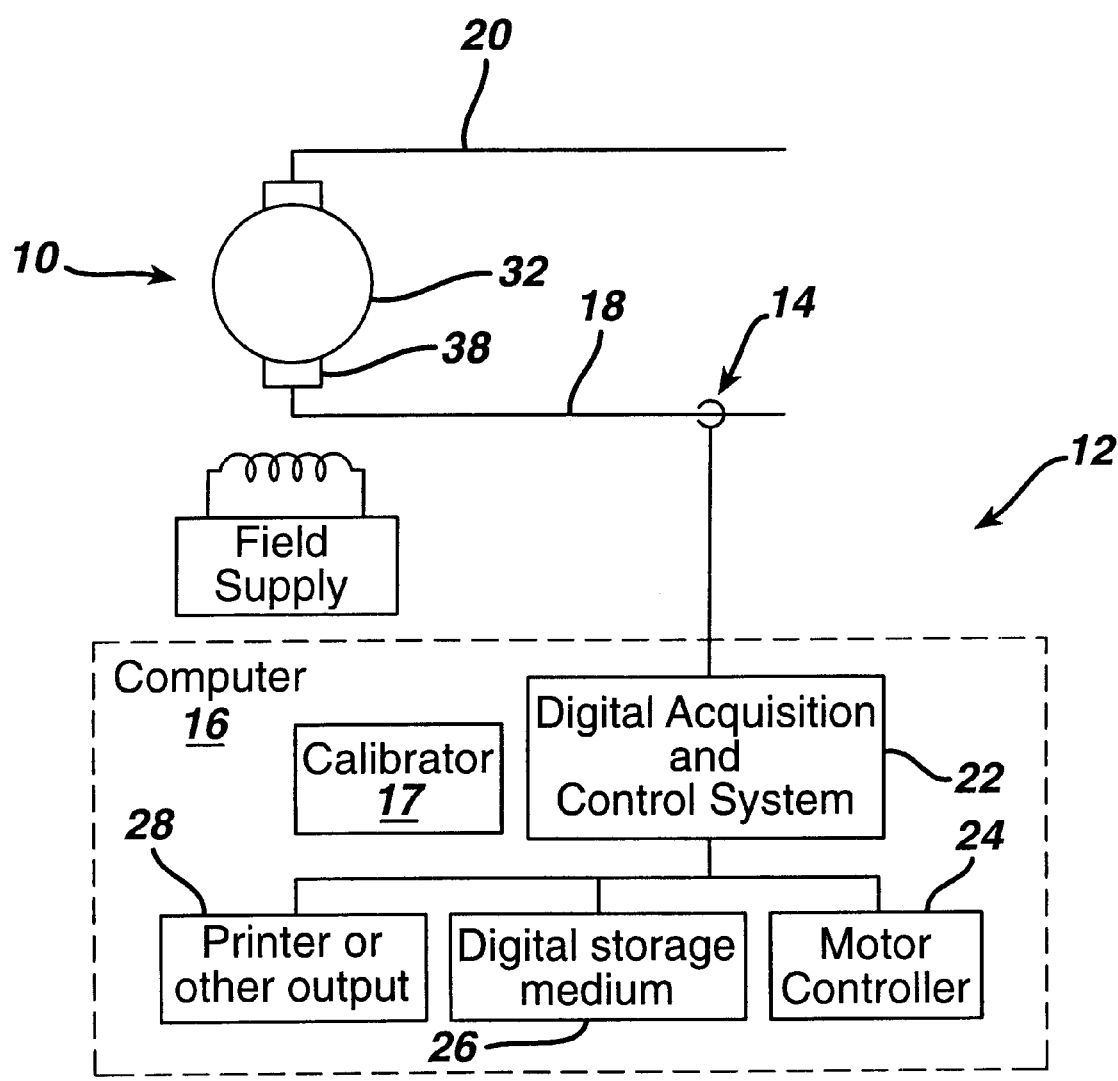
FIG. 2 is a block diagram of a monitoring system for a direct current machine which can be used in accordance with several embodiments of the present invention.

FIG. 1 includes partially cross-sectional axial and longitudinal views of a conventional dc machine commutator 32 and armature 30 such as is shown in Albert Still, ELEMENTS OF ELECTRICAL DESIGN, 2$^{nd}$ edition, 3$^{rd}$ impression, p 212 (1932), and FIG. 2 is a block diagram of a monitoring system for a direct current machine which can be used in accordance with several embodiments of the present invention.

In accordance with one embodiment of the present invention, a direct current machine 10 monitoring system 12 includes: (a) a current sensor 14 for monitoring load current of the machine; and (b) a computer 16 for (i) obtaining a rotation frequency of the machine by (aa) obtaining a first power spectrum of the load current, (bb) identifying significant peaks of the power spectrum, (cc) identifying one of the significant peaks as indicative of rotation frequency, and (dd) identifying a frequency of the identified peak as the rotation frequency, (ii) multiplying the rotation frequency and a machine trait number to obtain a trait-passing frequency, (iii) obtaining a second power spectrum in a range including the trait-passing frequency, (iv) determining a magnitude of a maximum peak in the second power spectrum, and (v) evaluating the magnitude of the maximum peak to assess a condition of the machine.

Current sensor 14 comprises a sensor having an appropriate bandwidth. In particular, when used on large machines, the current sensor is designed so as not to be saturated by dc current. The load current of interest comprises the alternating current (ac) component of the current present in the power leads 18 and 20 of the dc machine. The ac component results from commutation action, varying mechanical loads or sources, and varying electrical loads or sources. A normally operating machine displays peaks in the power spectrum of the load current (i.e., the linear spectrum of the current multiplied by its complex conjugate) corresponding to the frequency of rotation and to the frequency of the passing of commutator bars 34 (FIG. 1) under brushes 38 (FIG. 2).

As described in aforementioned Treanor et al., when the commutation action has been degraded, the switching transients associated with commutation produce a larger peak at the bar-passing frequency. The larger peak occurs because the switching transients occur at the passing of each commutator bar under a brush. Thus an increase in the bar-passing peak can be indicative of poor commutation. Poor commutation may be caused by a degradation of the commutator itself, by brush wear, by brush misalignment, by field compensation problems, or by load or supply induced commutation problems. Thus correcting a commutation fault will require differentiating between degradation of the commutator itself and degradation due to other aspects of machine operation.

Computer 16 may comprise an integral data processing unit or multiple separate data processing units. In the example of FIG. 2, computer 16 includes a digital acquisition and control system 22, a calibrator 17, a machine controller 24, a digital storage medium 26, and a printer or other output 28. In one embodiment, detection logic of the digital acquisition and control system 22 includes a fast-Fourier transform (FFT) spectrum analyzer, a passive filter, and a computer controller. In another embodiment, the computer comprises a conventional machine controller with additional software that perform the functions of the present invention.

Figure 3:
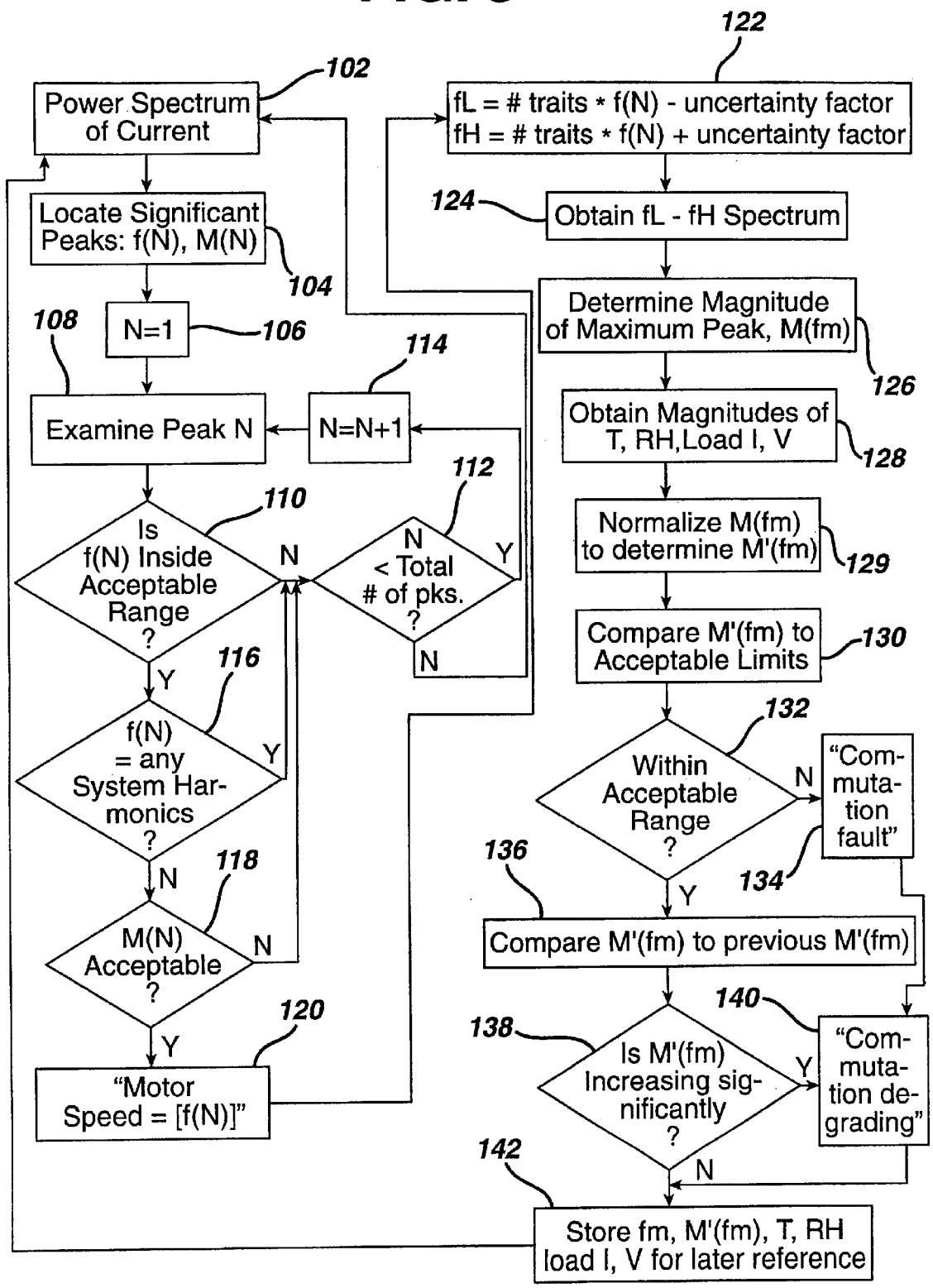
FIG. 3 is a flowchart of a process for machine monitoring in accordance with one embodiment of the present invention.

FIG. 3 is a flow chart illustrating one embodiment of logic used to interpret a power spectrum of the current. The power spectrum may be obtained using conventional spectrum-gathering techniques such as Fourier transform techniques, for example. When obtaining a first power spectrum of current at block 102, the range includes harmonics occurring in the once-per-rotation frequency range.

The significant peaks of the first power spectrum can be identified at block 104 by human sight or automatically by using computer routines, for example. In one embodiment, at block 106 a first one of the N significant peaks is identified for evaluation. The first one of the significant peaks can be selected using any of a number of criteria. Examples of potential criteria include criteria such as lowest frequency peak, largest magnitude peak, peak closest to the most recently obtained rotation frequency, or peak closest to an estimated rotation frequency.

The first one of the significant peaks is examined at block 108 to determine whether the frequency f(N) that it occurs at ("the first frequency") is within an acceptable range at block 110. If the frequency is not within an acceptable range, and the total number of significant peaks have not been evaluated (per block 112), a remaining peak is identified for examination at block 114. If all the peaks have been identified, then the logic loops back to obtaining a new power spectrum at block 102.

Similarly, it can be determined whether f(N) does not coincide with a system (power supply or load) frequency or harmonic, such as the speed or harmonic of the speed of a locomotive diesel engine, for example, at block 116 and whether a magnitude M(N) of the significant peak is within an acceptable range at block 118. In the event that the first frequency meets the above criteria, its peak can be identified as the rotation peak and the first frequency itself can be identified as the rotation frequency at block 120. Otherwise, blocks 108, 110, 112, 114, 116, and 118 are repeated using a different one of the significant peaks until a rotation frequency is identified at block 120 or until all of the significant peaks have been examined.

In one embodiment, the process of obtaining the rotation frequency further includes using an initial estimated frequency of rotation. If such estimated frequency is available, in a more specific embodiment, for example, peaks N can be initially selected to be those peaks situated most closely to the estimated frequency. The estimated frequency may be obtained using a speed sensor such as a tachometer or by using a speed command of a controller of the machine or a speed estimation based on motor parameter calculations, for example. In an alternative embodiment, the estimated frequency itself is used, and the process at blocks 102–120 is not used.

Once the rotation frequency has been obtained, at block 122 it is next multiplied by a number of machine traits to obtain a trait-passing frequency. In one embodiment, the trait number comprises a number of commutator bars 34 (FIG. 1) of the machine. In another embodiment, the machine trait number comprises a number of armature slots 36 (FIG. 1) of the machine.

At block 124 a second power spectrum, including the trait-passing frequency, is obtained. The load current data used to obtain the first and second spectra can either be of the same data set or separate data sets. If the same data set is used, the data set may be used to form multiple spectra using different sampling frequencies (decimation of original signal). Additionally, within any total spectrum, sub-spectra (portions of total spectrum) may be analyzed in more detail for feature extraction.

Several possibilities exist for selecting a range of frequencies (from low frequency fL to high frequency fH) for the second power spectrum. In one embodiment, as shown at block 122 for purposes of example, the range includes the trait-passing frequency plus or minus an uncertainty frequency. When separate data sets are used, a range can account for variation in rotation frequency during the time between acquisition of the first power spectrum and the second power spectrum. The uncertainty frequency itself may comprise a predetermined frequency. In one example, the uncertainty is estimated as 1 kHz, and the maximum peak is searched for over a 1 kHz range. Alternatively, the uncertainty frequency may comprise a variable frequency such as a rotation frequency uncertainty multiplied by the machine trait number.

Prior to obtaining the first power spectrum at block 102, sufficiently long strings of contiguous current data are acquired at a high enough sampling frequency to unambiguously determine the highest frequencies of interest. Trait-passing frequencies can be rather high. In embodiments wherein, trait passing frequencies reach about 8 kHz, for example, sampling frequencies of about 20 kHz are appropriate. In order to determine and locate the trait-passing frequencies with high confidence, the rotation frequency is preferably determined within about plus or minus 0.2 Hz so that when multiplied by the number of traits, the uncertainty of the trait passing frequency is minimized. By keeping the range of frequencies as small as possible, the likelihood of misreading another nearby frequency component such as vibration, converter harmonics, load oscillations, or pickup, for example, is minimized. For efficiency of computation, only a portion of the total data need be used to calculate the spectrum in the vicinity of the trait-passing frequency. Similarly, because the rotation frequency is relatively low compared with the trait-passing frequency, the entire data length (typically several seconds worth) can be used with the number of samples being reduced in decimation for computational efficiency. Interpolation techniques such as disclosed in commonly assigned Kliman et al., U.S. Pat. No. 4,761,703, can be used to improve precision and efficiency.

Typically an armature slot-passing frequency is an integral sub-multiple of a commutator bar-passing frequency. Although lower in frequency than the bar-passing frequency, the slot passing frequency typically has closer neighboring spectrum components. Thus an even smaller range is desirable for slot-passing frequency power spectrum analysis. Slot-passing frequency can be a more sensitive indicator of deteriorating commutation for some machines.

At block 126 the magnitude M(fm) of the maximum peak in the second power spectrum is determined. Optionally, at block 128 magnitudes of temperature, relative humidity, load current, and load voltage are additionally obtained.

At blocks 129–140 magnitude M(fm) is evaluated to assess a condition of the machine. In one embodiment, at block 129, magnitude M(fm) is normalized to determine M'(fm). One useful normalization technique is to divide the magnitude peak by a magnitude of the load current. In one embodiment, at block 130, the magnitude (preferably normalized) is compared to acceptable limits. Operating point information and previously obtained data for the machine can be used to determine an upper limit for the magnitude of the trait-passing frequency which can be used to determine whether the magnitude is within an acceptable range at block 132. Magnitudes outside of the acceptable range may be indicative of a commutation fault at block 134. If the comparison of magnitude with previously obtained magnitudes is determined to be increasing significantly at block 138, this trend is an additional indication of commutation degradation at block 140. Whether an increase is "significant" can be determined by empirical testing. For example, motors with known degrees of poor commutation can be measured to facilitate this determination. The obtained data can be stored at block 142 with the process then looping back to obtaining a first power spectrum at block 102.

Figure 4:
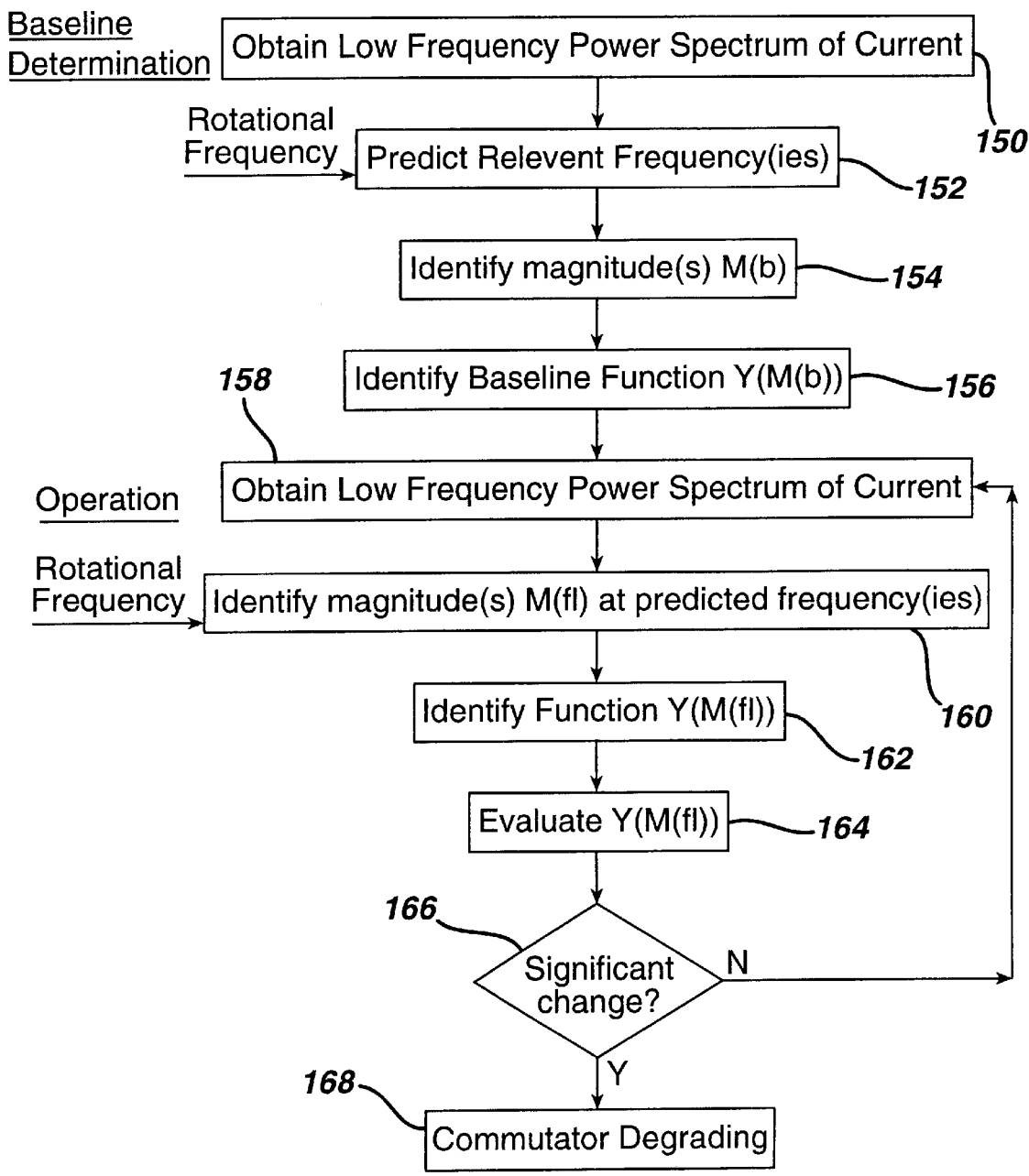
FIG. 4 is a flowchart of a process for machine monitoring in accordance with another embodiment of the present invention.

Alternatively or additionally, other control processing can be implemented in response to commutation fault and/or degradation indications. FIG. 4 is a flowchart of a process for machine monitoring in accordance with another embodiment of the present invention which can be used either as an alternative or as an additional process to that of the embodiment of FIG. 3 The logic used in FIG. 4 includes obtaining a low frequency power spectrum (a "third" power spectrum"). Correlation of low and high frequency power spectra can be used to differentiate commutator-caused commutation degradation from other causes.

In aforementioned Treanor et al., the commutator itself was in good condition and effects of poor commutation were generated by adjusting brush position and by bucking or boosting the machine (that is, by misadjusting). Low frequency harmonics of the rotational frequency were examined but no regular patterns or trends were identified.

It has since been determined that low frequency harmonics of the rotational frequency can be used to assess the condition of the commutator. The existence of a commutator that is no longer round greatly accelerates the rate of brush wear. Thus, it is very beneficial to be able to distinguish commutation degradation that is due to the commutator itself.

In one embodiment of the invention, in addition to obtaining and evaluating the magnitude of the maximum peak in the second power spectrum as described above with respect to FIG. 3, computer 16 is further adapted to obtain a third power spectrum of the load current in a low frequency range, obtain at least one magnitude of a component of the third power spectrum at a respective predicted frequency, and evaluate the at least one magnitude to differentiate whether a degradation of the direct current machine is due to commutator degradation. As discussed above with respect to the first and second power spectra, the load current data used to obtain the third power spectrum can either be of the same data set as the second power spectrum or a separate data set.

Prior to operating and monitoring the motor, it is useful to develop information regarding baseline operating conditions. A calibrator 17 can be used to perform the calibration. In one embodiment, calibrator 17 is included in software within computer 16 as shown in FIG. 1. Alternatively, calibrator 17 may comprise a separate instrument or computer. A calibrator can be used to calibrate dc machines individually, or, if a number of identical machines are being fabricated, a calibrator can be used to obtain baseline information from one or more machines of the group.

Referring again to FIG. 4, in one embodiment, at block 150 a low frequency power spectrum of current is obtained from a known good motor. Relevant frequencies are predicted at block 152. At a minimum, the relevant frequency is the rotational frequency. Typically a plurality of relevant frequencies, including the rotational frequency and harmonics of the rotational frequency, are used. The rotational frequency may be obtained as described in blocks 102–120 of FIG. 3 or by using a speed sensor such as a tachometer or by using a speed command of a controller of the machine or a speed estimation based on motor parameter calculations, for example.

At block 154 at least one magnitude M(b) of the power spectrum at a respective relevant frequency is identified. The at least one magnitude itself can later be used for evaluation purposes, or, and depending on the application, at block 156 a baseline function Y(M(b)) based on the at least one magnitude can additionally be identified.

Once the baseline determination is made, during operation a low frequency power spectrum of current is obtained at step 158, and the rotational frequency is used to identify at least one magnitude M(fl) at a respective predicted frequency at block 160. When combined with the logic of FIG. 3, the at least one magnitude of the component can then be evaluated to differentiate whether a degradation of the direct current machine is due to commutator degradation.

Similar to the above description of block 156, computer 16 (FIG. 1) can be adapted to evaluate the at least one magnitude by identifying a function of the at least one magnitude at block 162 and evaluating the function at block 164. Identifying the function may include normalizing the at least one magnitude. As discussed above, normalizing may be accomplished, for example, by dividing the at least one magnitude by a magnitude of the load current.

In one embodiment wherein a plurality of magnitudes (preferably normalized magnitudes) in the time-frequency spectrum are identified, the function comprises an average of the plurality of magnitudes. The average may comprise a simple average or an average that is weighted with frequencies of higher relevance having higher weights. In an alternative or additional embodiment, the function comprises a distribution index of the plurality of magnitudes. For example, the distribution is expected to have a peak magnitude at the rotational frequency component and decreasing magnitudes as the harmonic orders increase. The shape of the profile can be monitored with a factor such as flatness being compared and/or trended at blocks 164 and 166. If an indication of commutation degradation was provided at block 134 or 140 of FIG. 3 and an indication of commutation degradation results in block 168 of FIG. 4, it can be inferred that the degradation is due to commutator 32 (FIG. 1).

Figure 5:
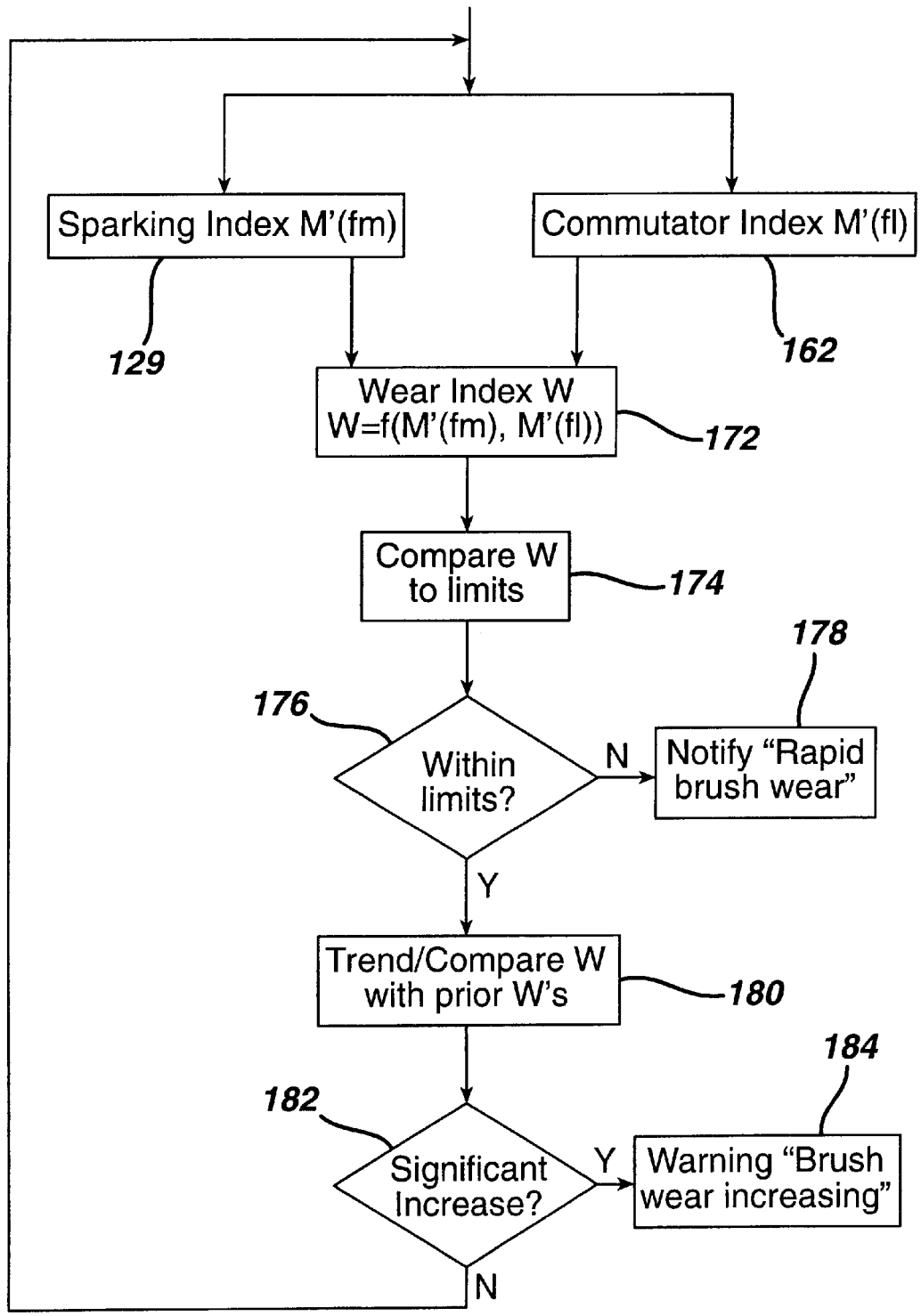
FIG. 5 is a flowchart of a process for machine monitoring in accordance with another embodiment of the present invention.

FIG. 5 is a flowchart of a process for machine monitoring in accordance with another embodiment of the present invention for machine monitoring. This technique is expected to be particularly useful for flagging rapid brush wear conditions.

In this embodiment, computer 16 (FIG. 2) obtains a first power spectrum of the load current in a range including the trait-passing frequency and a second power spectrum of the load current including frequencies in a low frequency range; determines a first magnitude of a maximum peak in the first power spectrum; and obtains at least one second magnitude of a component of the second power spectrum at a respective predicted frequency, and evaluates the first and second magnitudes to assess commutation degradation of the machine. Although separate data sets of load current can be used for the power spectra, preferably the same data set is used for both power spectra.

In one embodiment, both the first and second magnitudes are normalized to provide normalized magnitudes shown as "sparking index M'(fm)" at block 129 (also shown in FIG. 3) and "commutator index M'(fl)" at block 162 (also shown in FIG. 3). At block 172, evaluating further includes using the normalized first and second magnitudes to identify a wear index W. In one embodiment, for example W can be expressed as:

$$W = aM'(fm) + bM'(fl),$$

wherein a and b are empirically determined constants.

As shown at blocks 174–184, evaluating may further include comparing the wear index to limits at block 174 for determining whether the wear index is within an acceptable range at block 176 and trending and/or comparing the wear index with preceding wear indexes at block 180 for determining whether the wear index is increasing over time at block 182. Out of range wear indices can be flagged at block 178, and significantly increasing wear indices can be flagged at block 184.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A system for determining a rotation frequency of a direct current machine comprising:
   (a) a sensor for monitoring load current of the machine; and
   (b) a computer for
      (i) obtaining a power spectrum of the load current,
      (ii) identifying significant peaks of the power spectrum,
      (iii) identifying one of the significant peaks as indicative of rotation frequency, and
      (iv) identifying a frequency of the identified peak as the rotation frequency.

2. The system of claim 1 wherein the one of the significant peaks comprises a rotation peak and wherein the computer is adapted to identify the rotation peak by
   (a) determining whether a magnitude of a first one of the significant peaks is within an acceptable range, whether a first frequency of the first one of the significant peaks is within an acceptable frequency range, and whether the first frequency does not coincide with a system harmonic frequency, and
   (b)(1) if so, identifying the first one of the significant peaks as the rotation peak, or
   (b)(2) if not, repeating (a) using a different one of the significant peaks.

3. A direct current machine monitoring system comprising:
   (a) a current sensor for monitoring load current of the machine; and
   (b) a computer for
      (i) obtaining a rotation frequency of the machine by (aa) obtaining a first power spectrum of the load current, (bb) identifying significant peaks of the first power spectrum, (cc) identifying one of the significant peaks as indicative of rotation frequency, and (dd) identifying a frequency of the identified peak as the rotation frequency,
      (ii) multiplying the rotation frequency and a machine trait number to obtain a trait-passing frequency,
      (iii) obtaining a second power spectrum in a range including the trait-passing frequency,
      (iv) determining a magnitude of a maximum peak in the second power spectrum, and
      (v) evaluating the magnitude of the maximum peak to assess a condition of the machine.

4. The system of claim 3 wherein evaluating the magnitude of the maximum peak includes normalizing the magnitude of the maximum peak.

5. The system of claim 4 wherein normalizing the magnitude of the maximum peak includes dividing the magnitude of the maximum peak by a magnitude of the load current.

6. The system of claim 5 wherein evaluating the magnitude of the maximum peak includes determining whether the normalized magnitude of the maximum peak is within an acceptable range.

7. The system of claim 5 wherein evaluating the magnitude of the maximum peak includes determining whether the normalized magnitude of the maximum peak is increasing significantly.

8. The system of claim 3 wherein the condition comprises commutation quality.

9. The system of claim 3 wherein the one of the significant peaks comprises a rotation peak and wherein the computer is adapted to identify the rotation peak by
   (a) determining whether a magnitude of a first one of the significant peaks is within an acceptable range, whether a first frequency of the first one of the significant peaks is within an acceptable frequency range, and whether the first frequency does not coincide with a system harmonic frequency, and
   (b)(1) if so, identifying the first one of the significant peaks as the rotation peak, or
   (b)(2) if not, repeating (a) using a different one of the significant peaks.

10. The system of claim 3 wherein the machine trait number comprises a number of commutator bars or armature slots of the machine.

11. A direct current machine monitoring system comprising:
   (a) a current sensor for monitoring load current of the machine; and
   (b) a computer for
      (i) obtaining a power spectrum in a range including a machine trait-passing frequency,
      (ii) determining a magnitude of a maximum peak in the power spectrum in a range including the trait-passing frequency plus or minus an uncertainty frequency, and
      (iii) evaluating the magnitude of the maximum peak to assess a condition of the machine.

12. The system of claim 11 wherein evaluating the magnitude of the maximum peak includes normalizing the magnitude of the maximum peak.

13. The system of claim 12 wherein normalizing the magnitude of the maximum peak includes dividing the magnitude of the maximum peak by a magnitude of the load current.

14. The system of claim 11 where the uncertainty frequency comprises a rotation frequency uncertainty multiplied by a machine trait number.

15. The system of claim 14 wherein the machine trait number comprises a number of commutator bars or armature slots of the machine.

16. The system of claim 14 wherein the rotation frequency comprises an estimated frequency of rotation.

17. The system of claim 11 wherein the computer is further adapted to
   (i) obtain an additional spectrum of the load current, the additional spectrum including frequencies in a low frequency range,
   (ii) obtain at least one magnitude of a component of the additional power spectrum at a respective predicted frequency, and
   (iii) evaluate the at least one magnitude of the component to differentiate whether a degradation of the direct current machine is due to commutator degradation.

18. The system of claim 17 wherein the computer is adapted to evaluate the at least one magnitude by identifying a function of the at least one magnitude and evaluating the function.

19. The system of claim 18 wherein identifying the function includes normalizing the at least one magnitude by dividing the at least one magnitude by a respective magnitude of the load current.

20. The system of claim 18 wherein the at least one magnitude comprises a plurality of magnitudes and wherein the function comprises an average of the plurality of magnitudes.

21. The system of claim 18 wherein the at least one magnitude comprises a plurality of magnitudes and wherein the function comprises a distribution index of the plurality of magnitudes.

22. A direct current machine monitoring system comprising:
   (a) a current sensor for monitoring load current of the machine; and
   (b) a computer for
      (i) obtaining a rotation frequency of the machine,
      (ii) multiplying the rotation frequency and a machine trait number to obtain a trait-passing frequency,
      (iii) obtaining a first power spectrum of the load current in a range including the trait-passing frequency and a second power spectrum of the load current including frequencies in a low frequency range,
      (iv) determining a first magnitude of a maximum peak in the first power spectrum,
      (v) obtaining at least one second magnitude of a component of the second power spectrum at a respective predicted frequency, and
      (vi) evaluating the first and second magnitudes to assess commutation degradation of the machine.

23. The system of claim 22 wherein evaluating includes normalizing the first and second magnitudes and using the normalized first and second magnitudes to identify a wear index.

24. The system of claim 23 wherein evaluating further includes determining whether the wear index is within an acceptable range and determining whether the wear index is increasing over time.

25. A direct current machine monitoring system comprising:
   (a) a current sensor for monitoring load current of the machine; and
   (b) a computer for
      (i) obtaining a low frequency power spectrum of the load current,
      (ii) obtaining at least one magnitude of a component of the power spectrum at a respective predicted frequency, and
      (iii) evaluating the at least one magnitude of the component to assess a condition of the machine.

26. The system of claim 25 wherein the computer is adapted to evaluate the at least one magnitude by identifying a function of the at least one magnitude and evaluating the function.

27. The system of claim 26 wherein identifying the function includes normalizing the at least one magnitude.

28. The system of claim 27 wherein normalizing the at least one magnitude includes dividing the at least one magnitude by a magnitude of the load current.

29. The system of claim 26 further including a calibrator for performing a calibration to identify baseline functions at respective predicted frequencies and wherein the computer is adapted to use the baseline functions when evaluating the function.

30. The system of claim 26 wherein the at least one magnitude comprises a plurality of magnitudes and wherein the function comprises an average of the plurality of magnitudes.

31. The system of claim 26 wherein the at least one magnitude comprises a plurality of magnitudes and wherein the function comprises a distribution index of the plurality of magnitudes.

* * * * *